(12) United States Patent
Tsorng et al.

(10) Patent No.: US 11,297,750 B2
(45) Date of Patent: Apr. 5, 2022

(54) MECHANISM TO RELEASE CARDS AND OTHER COMPONENTS FROM COMPUTER

(71) Applicant: QUANTA COMPUTER INC., Taoyuan (TW)

(72) Inventors: Yaw-Tzorng Tsorng, Taoyuan (TW); Chun Chang, Taoyuan (TW); Jhih-Hong Wang, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 454 days.

(21) Appl. No.: 16/047,390

(22) Filed: Jul. 27, 2018

(65) Prior Publication Data
US 2019/0294219 A1 Sep. 26, 2019

Related U.S. Application Data

(60) Provisional application No. 62/646,527, filed on Mar. 22, 2018.

(51) Int. Cl.
*H05K 13/04* (2006.01)
*H05K 7/14* (2006.01)
(Continued)

(52) U.S. Cl.
CPC ......... *H05K 13/0491* (2013.01); *G06F 1/182* (2013.01); *G06F 1/183* (2013.01);
(Continued)

(58) Field of Classification Search
CPC ........... H05K 13/0486; H05K 13/0493; H05K 7/1069; H05K 7/1402; H05K 7/1409;
(Continued)

(56) References Cited

U.S. PATENT DOCUMENTS 4,894,910 A * 1/1990 Reimer .............. H05K 13/0491
228/234.2
6,003,689 A 12/1999 Babineau et al.
(Continued)

FOREIGN PATENT DOCUMENTS

CN 101344802 A 1/2009
CN 103105909 A 5/2013
(Continued)

OTHER PUBLICATIONS

TW Office Action for Application No. 107132562, dated Jul. 8, 2019, w/ First Office Action Summary.
(Continued)

*Primary Examiner* — A. Dexter Tugbang
(74) *Attorney, Agent, or Firm* — Nixon Peabody LLP

(57) ABSTRACT

A lifting structure in the form of a release hook configured to conveniently and easily release computer components from their supporting structure by a simple pivoting action in response to lifting of thumbscrews. A typical computer component would be a PCIe card within a GPU tray. The lifting structure does not require the use of tools to release the computer components, and can be used where computer components ordinarily cannot be released by human fingers due to limitations of space. The lifting structure lifts the computer component to a height where the computer component can then be easily grasped by human fingers for removal of the component.

8 Claims, 12 Drawing Sheets

(51) Int. Cl.
  *G06F 1/18*    (2006.01)
  *G06F 13/40*   (2006.01)
  *H05K 7/10*    (2006.01)
  *H05K 7/20*    (2006.01)
(52) U.S. Cl.
  CPC .............. *G06F 1/185* (2013.01); *G06F 1/186* (2013.01); *H05K 7/1409* (2013.01); *H05K 13/0486* (2013.01); *G06F 13/409* (2013.01); *G06F 13/4068* (2013.01); *H05K 7/1069* (2013.01); *H05K 7/1402* (2013.01); *H05K 7/1407* (2013.01); *H05K 7/1469* (2013.01); *H05K 7/20809* (2013.01); *Y10T 29/53283* (2015.01)
(58) Field of Classification Search
  CPC ............. H05K 7/1469; H05K 13/0491; H05K 7/1407; H05K 7/20809; G06F 1/182; G06F 1/183; G06F 1/185; G06F 1/186; G06F 13/4068; G06F 13/409; Y10T 29/53283
  See application file for complete search history.

(56) References Cited

U.S. PATENT DOCUMENTS

| | | | | |
|---|---|---|---|---|
| 6,018,867 | A * | 2/2000 | Boe ................... | Y10T 29/53283 29/258 |
| 2005/0181662 | A1* | 8/2005 | Greiser ............... | H05K 7/1409 439/483 |
| 2006/0215373 | A1* | 9/2006 | Joist .................... | H05K 7/1409 361/726 |
| 2007/0082513 | A1* | 4/2007 | Zheng ................. | H05K 7/1069 439/70 |
| 2010/0244996 | A1* | 9/2010 | Kuo ..................... | G06F 13/409 333/238 |
| 2011/0277967 | A1* | 11/2011 | Fried .................. | H05K 7/20809 165/104.26 |
| 2012/0039044 | A1* | 2/2012 | Tan ..................... | G06F 13/4068 361/709 |
| 2013/0120928 | A1 | 5/2013 | Peng et al. | |
| 2016/0018859 | A1 | 1/2016 | Mao et al. | |
| 2016/0219745 | A1* | 7/2016 | Loparco .............. | H05K 7/1407 |
| 2016/0278231 | A1* | 9/2016 | Tsai .................... | H05K 7/1489 |
| 2017/0125943 | A1 | 5/2017 | Mozer et al. | |

FOREIGN PATENT DOCUMENTS

| | | | |
|---|---|---|---|
| CN | 103823510 | A | 5/2014 |
| CN | 105302234 | A | 2/2016 |
| CN | 107046212 | A | 8/2017 |
| JP | 2002-237689 | A | 8/2002 |
| JP | 2008-47746 | A | 2/2008 |
| JP | 2009265781 | A * | 11/2009 |
| TW | 543814 | U | 7/2003 |
| TW | 584222 | U | 4/2004 |

OTHER PUBLICATIONS

JP Office Action for Application No. 2018-221163, dated Dec. 24, 2019, w/ First Office Action Summary.

Extended European Search Report for EP Application No. 18202964.5, dated May 17, 2019.

CN Office Action for Application No. 2018-11146592.2, dated Nov. 4, 2020, w/ Second Office Action Summary.

CN Search Report for Application No. 2018-11146592.2, dated Nov. 4, 2020, w/ Second Office Action.

* cited by examiner

MECHANISM TO RELEASE CARDS AND OTHER COMPONENTS FROM COMPUTER

CROSS REFERENCE TO RELATED APPLICATIONS

This application claims priority to and the benefit of United States Provisional Patent Application No. 62/646,527, entitled "NEW EASY SERVICE STRUCTURE OF COMPUTER" and filed Mar. 22, 2018, the entire contents of which are incorporated by reference as if fully set forth herein.

FIELD

This disclosure relates to a convenient structure to release computer components from a supporting structure. The disclosed service structure does not require the use of tools to release computer components, and can be used where computer components ordinarily cannot be released due to limitations of space.

BACKGROUND

There are many examples of computer components that must be fastened to a support structure—such as a printed circuit board ("PCB"), tray, or chassis. However, in some cases, some of these components must also be able to be released from the computer support structure, such as for repair/replacement. One example of such a component is a peripheral component interconnect express ("PCIe") card, which may be released from a graphics processing unit ("GPU") tray. For this type of PCIe card, the use of tools is ordinarily required to effect the release of the PCIe card from the GPU tray. However, the use of a PCIe card is exemplary only and not limiting, as many types of computer components require the assistance of a tool to remove and/or replace the component.

There is a long felt need to provide the ability to release computer components, including PCIe cards, from computer support structure without the need to carry tools. There has also been a long-standing need for improving the manner in which the release of such computer components is effected, especially where the space limitations complicate the release of such computer component, even with the use of a tool.

SUMMARY

It is an object of the present disclosure to provide a new service structure to fasten and release computer components from a supporting structure, such as a tray or chassis.

It is also an object to provide a new service structure that can readily release computer components from its supporting structure without the need for tools.

This new service structure also permits release of computer components from their supporting structure where previously, such release was complex, or even prohibited, due to space limitations.

In one embodiment according to the present disclosure, a release hook is provided that includes thumbscrews, in addition to a fixing structure attached to a release hook.

In another embodiment, a push lever release comprises a release base and a release lever that is pivotably attached to the release base.

In still further embodiments, a system of releasing PCIe cards can be achieved by the combination of the release hook and release lever.

These and other objects will be better understood when read in connection with the detailed description and the appended drawings.

DETAILED DESCRIPTION

Figure 1:
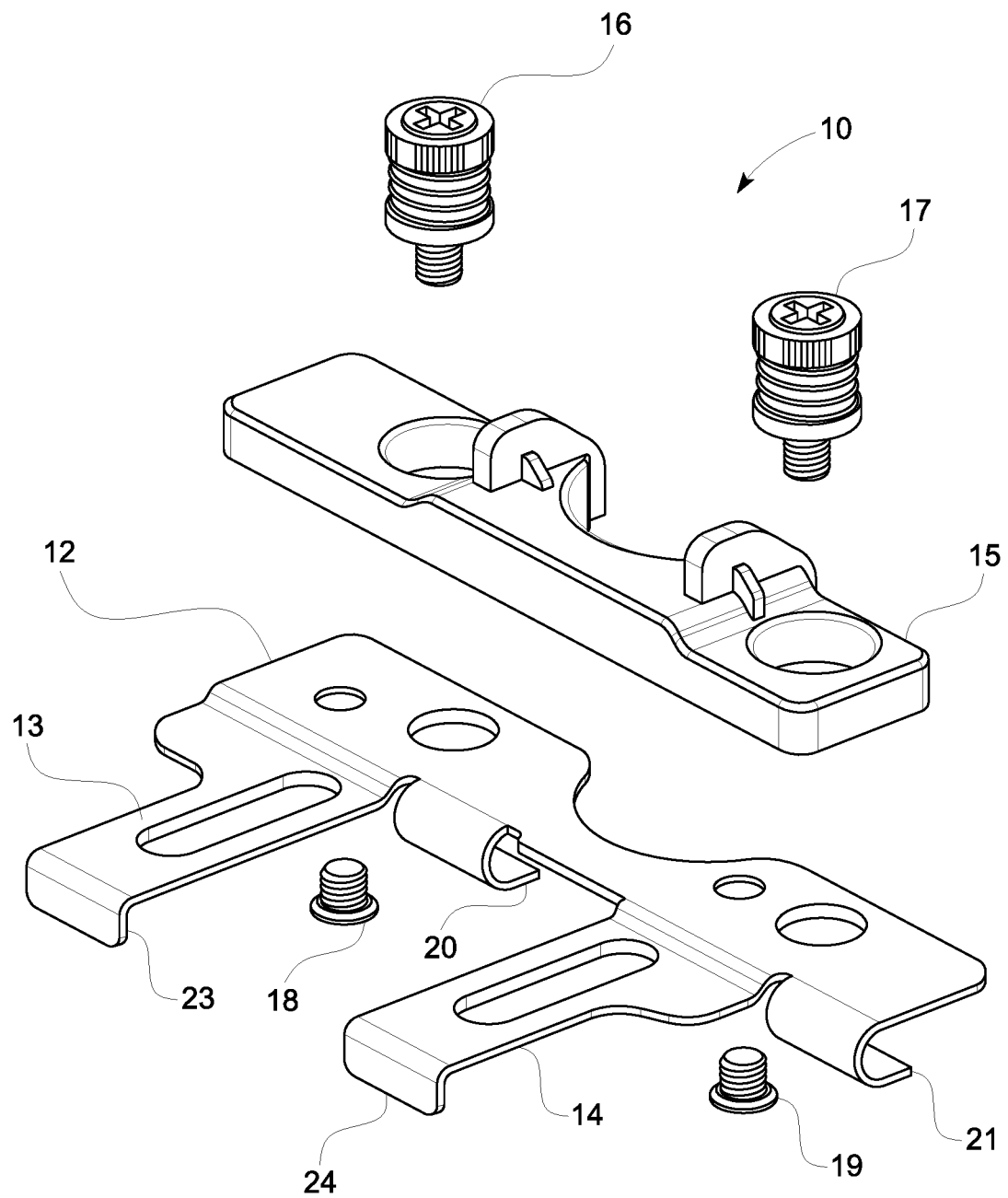
FIG. 1 is a schematic representation of an exploded view of a release hook, according to the present disclosure.

The present invention is described with reference to the attached figures, where like reference numerals are used throughout the figures to designate similar or equivalent elements. The figures are not drawn to scale and are provided merely to illustrate the instant invention. Several aspects of the invention are described below with reference to example applications for illustration. It should be understood that numerous specific details, relationships, and methods are set forth to provide a full understanding of the invention. Those skilled in the art will appreciate that not every element is visible in each figure of the drawings. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As noted above, many types of computer components, such as cards, are secured in place in a computer or in part of a computer, such as a chassis, tray, motherboard, etc. There are occasions when these computer components need to be removed from their secured place for inspection, repair, or replacement. In general, these components can only be released with the aid of a tool, as the clearance for use solely of the hand or fingers is so confined that the component cannot be dislodged from it secured location. Not only does this mean that one must carry tools with him, but also, because of the lack clearances, several tools may be needed to lift or dislodge a computer component from its position. FIG. 1 illustrates, in exploded view, the details of an exemplary release hook structure 10 in accordance with the present disclosure.

Figure 2A:
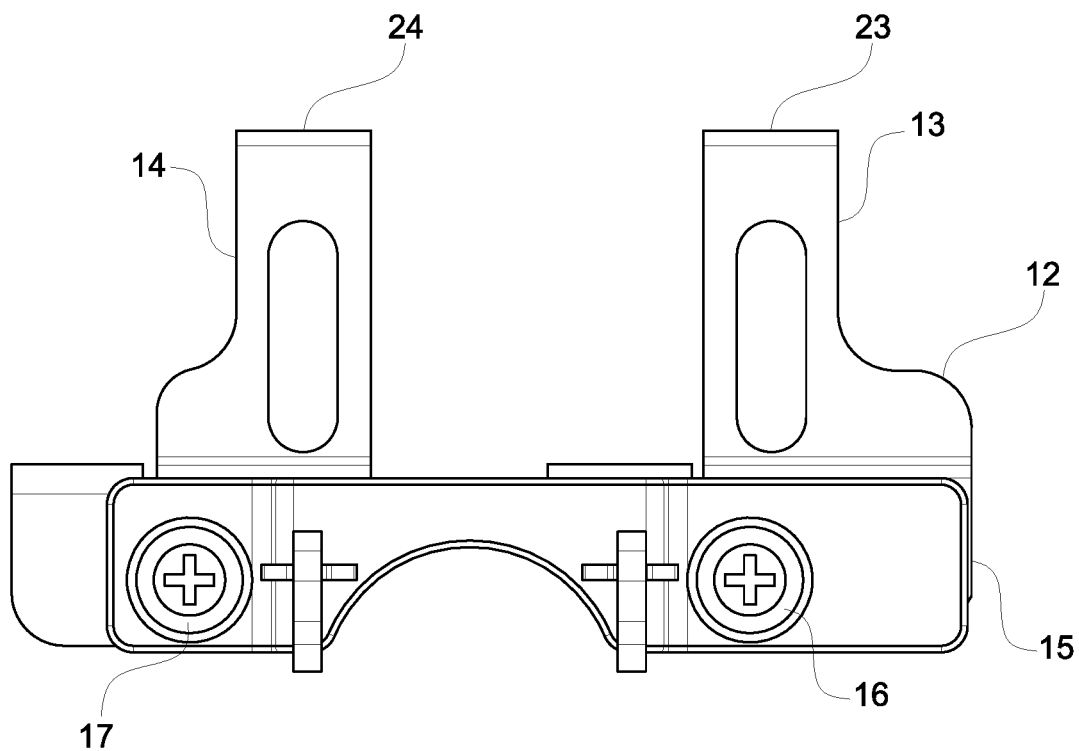
FIG. 2A is a schematic, plan view of the release hook of FIG. 1.
Figure 2B:
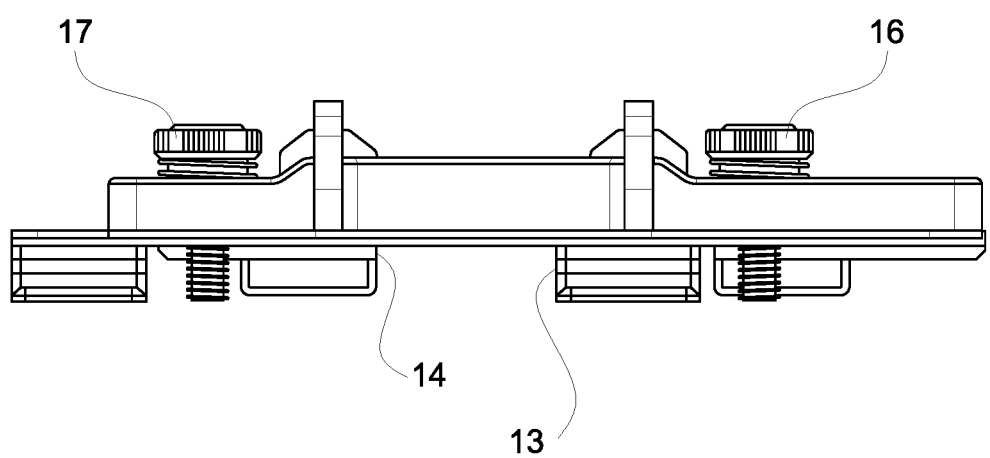
FIG. 2B is a schematic, elevation view of the release hook of FIG. 1.
Figure 2C:
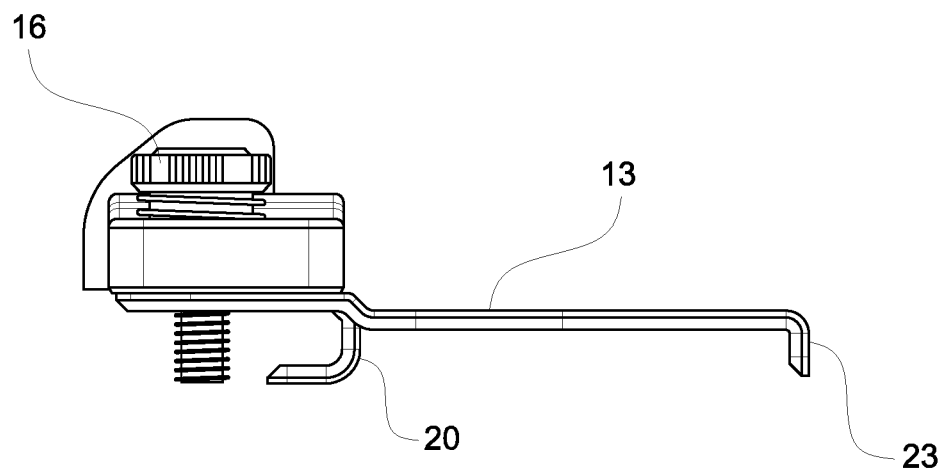
FIG. 2C is a schematic, left side view of the release hook of FIG. 1.
Figure 2D:
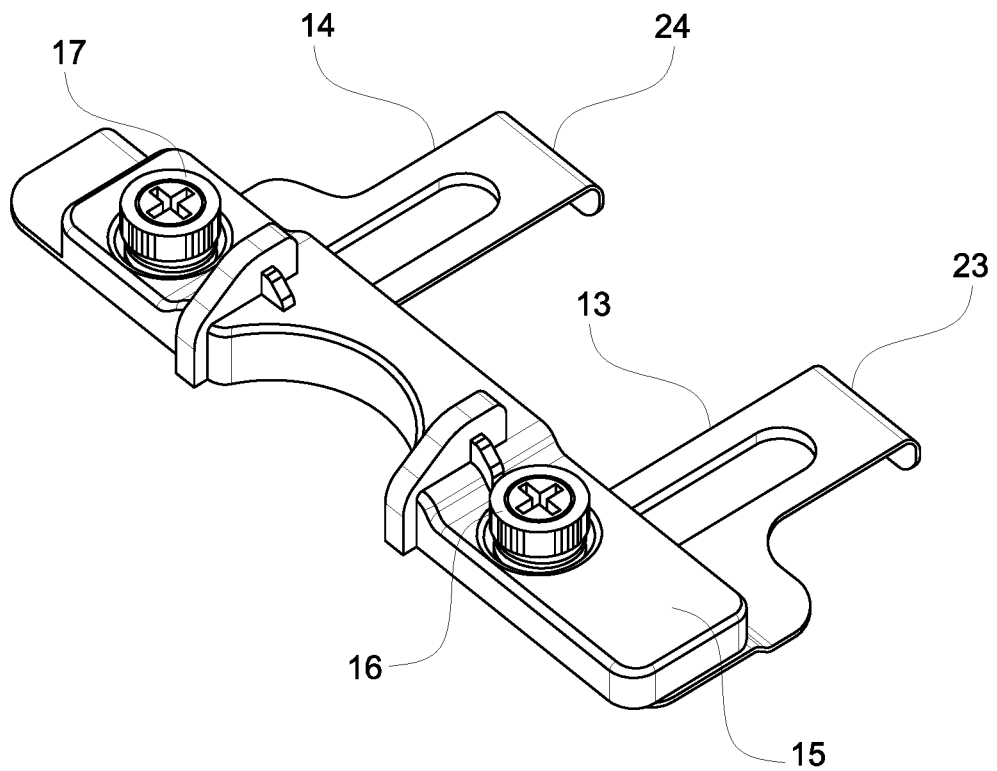
FIG. 2D is a schematic, perspective view of the release hook of FIG. 1.

FIG. 2A is a schematic, plan view of a release hook structure 10, clearly illustrating the thumbscrews 16, 17 that permit raising of the pivot claws 20, 21 (not visible in FIG. 2A). FIG. 2B is a schematic, elevation view of the release hook of FIG. 1 illustrating the position of arms 13, 14 in a position below fixing element 15. FIG. 2C is a schematic, left side view of the release hook of FIG. 1, and illustrating the claw 20, which begins the lifting of the card, as the thumbscrews 16, 17 are lifted upwardly. FIG. 2D is a schematic, perspective view of release hook structure 10. A release hook 12 (from FIG. 2A) is provided with one or more arms 13, 14 to act as a lever to pivot claws 20, 21 out of a position supporting a computer component within a supporting structure and to lift a computer component from its operative position. The arms 13, 14 are provided to act as levers when rotating the lifting hook structure 10. A fixing element 15 is provided in order to mount the release hook 12. One or more thumbscrews 16, 17 is provided to move release hook 12 from a position holding a computer component to a chassis, tray, or other supporting structure of a computer. A series of screws 18, 19 are used to secure fixing element 15 to release hook 12.

Figure 3A:
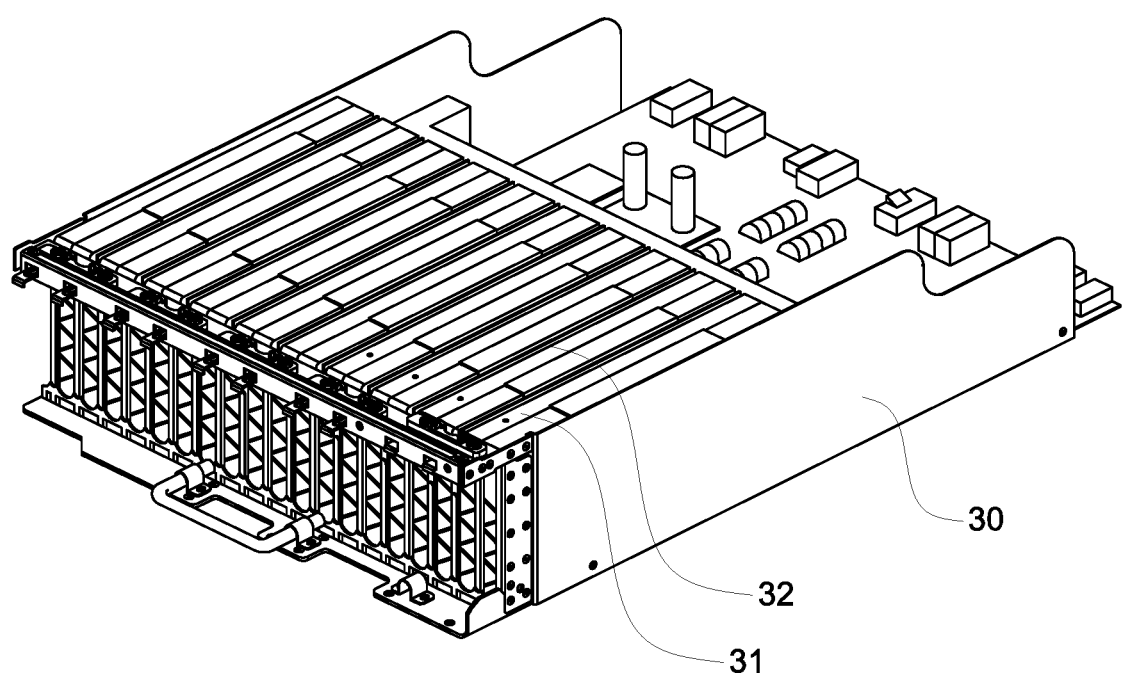
FIG. 3A is a schematic, perspective view of a GPU, including a plurality of PCIe cards contained therein, which are secured by the release hook of the instant disclosure.
Figure 3B:
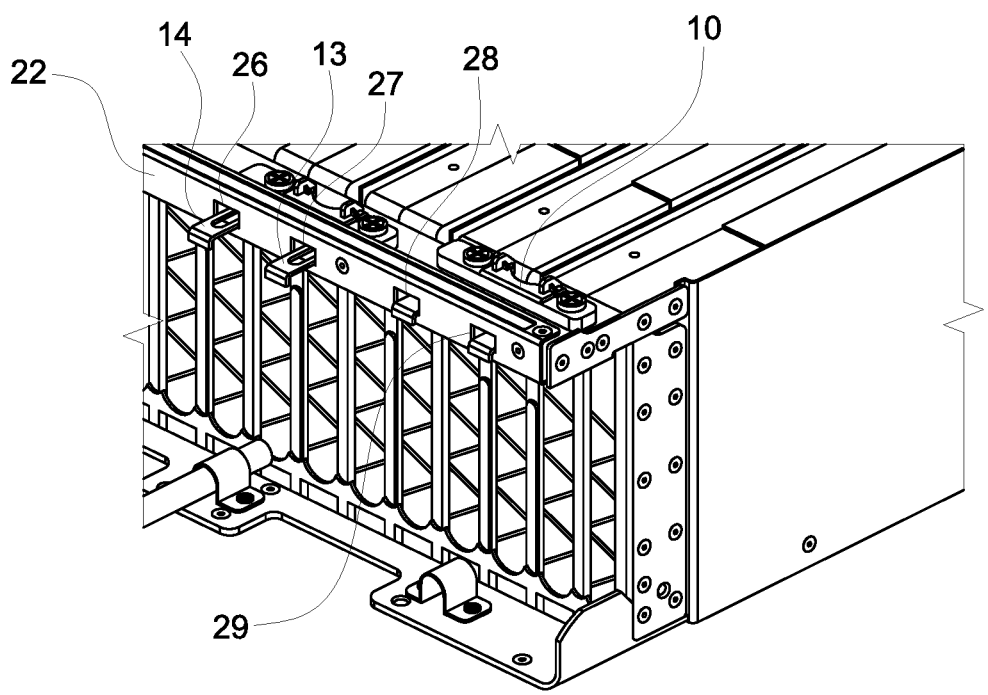
FIG. 3B is a schematic, enlarged view of a portion shown by dotted line 38 of FIG. 3A to show detail.
Figure 3C:
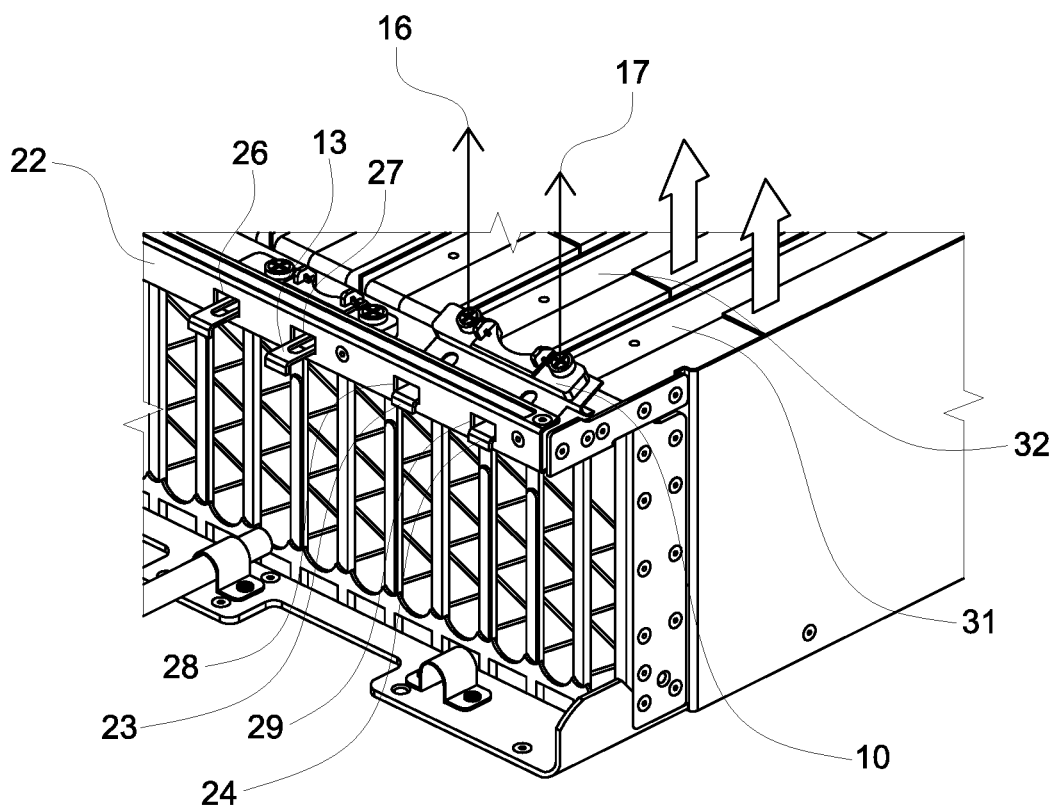
FIG. 3C is a schematic view of the thumbscrews and the release hook when the thumbscrews are pulled upwardly to release the PCIe cards.

FIGS. 3A-3C illustrate the use of release hook 10 in the environment of PCIe cards in a GPU tray, although this same configuration and structure can be employed to release components other than PCIe cards. GPU tray 30 contains a series of PCIe cards 31, 32, etc. In order to hold and release the PCIe cards, use is made of the release hook structure 10. As shown in FIG. 3B, a rail 22 is provided. The rail 22 defines a plurality of openings or slots 26, 27, 28, 29, through which arms 13, 14, of the lifting hook structure 10 can extend. Arms 13, 14 can extend through adjacent slots in rail 22 (FIGS. 3B, 3C). The rail 22 can retain and capture the arms 13, 14, especially if the arms 13, 14 are each provided with a flange 23, 24, respectively. The release hook structure 10 can retain the PCIe cards in their required position when in their operative position. However, when it is desired to remove the PCIe cards, the thumbscrews 16, 17 are pulled upwardly, as shown in FIG. 3C. This action in pulling thumbscrews 16, 17 upwardly acts to rotate pivot claws 20, 21, thereby simultaneously releasing and lifting the PCIe card from GPU tray 30.

Figure 4A:
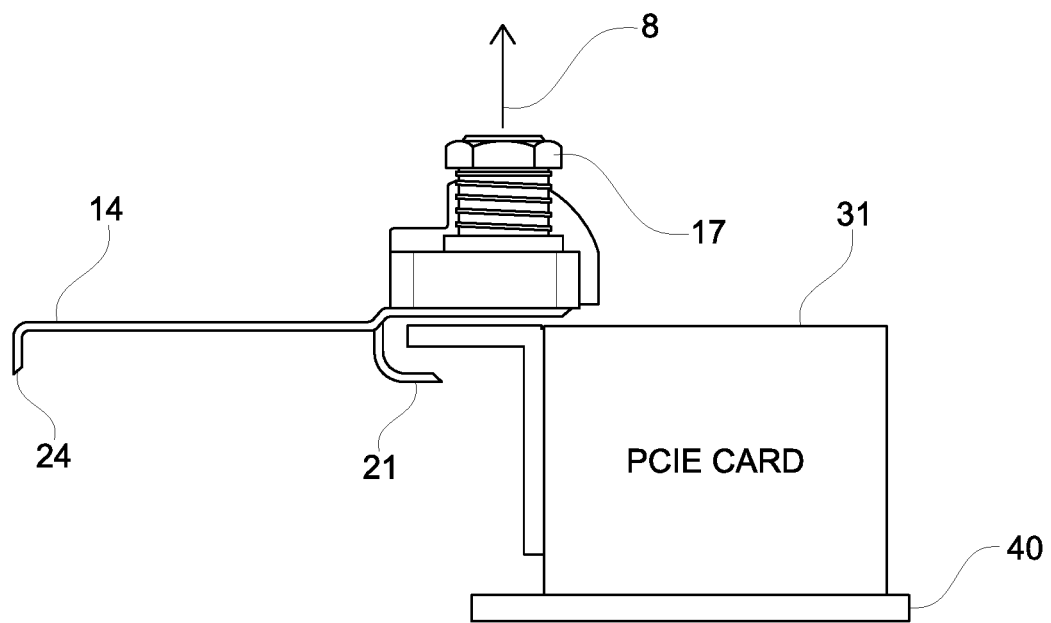
FIG. 4A is a schematic illustration of the release hook locking feature when resting upon a PCIe card.
Figure 4B:
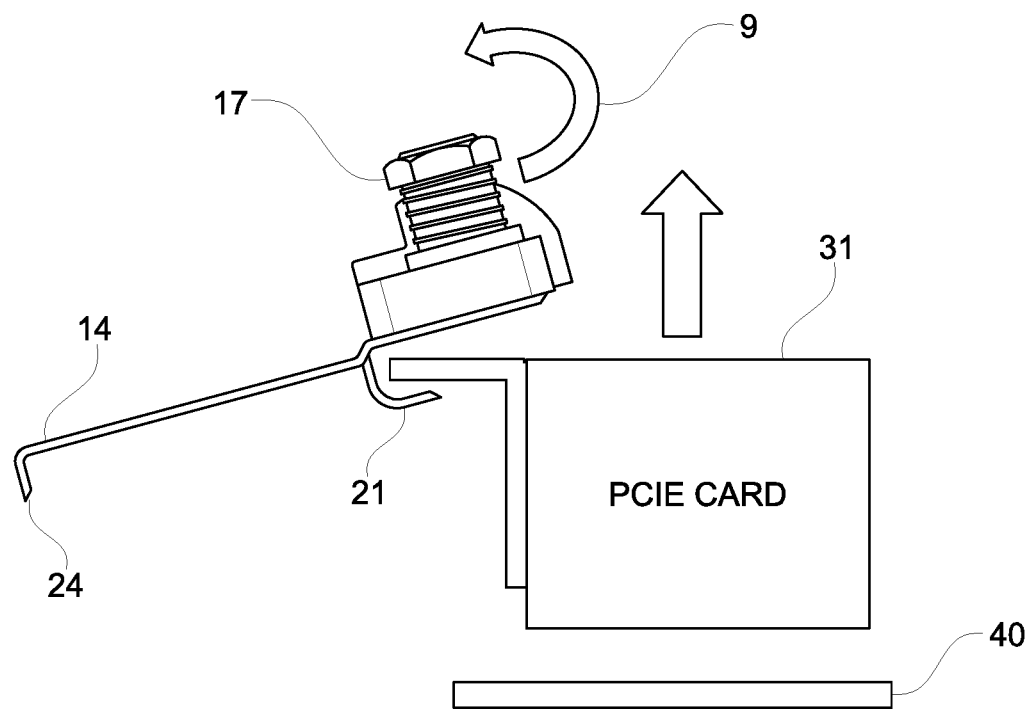
FIG. 4B is a schematic illustration of the releasing feature of the release hook in exerting a lifting force upon a PCIe card, when the thumbscrew is lifted upwardly.

This action is shown schematically in FIGS. 4A and 4B. The initial upward movement on thumbscrews 16, 17 (in direction of arrow 8, as shown in FIG. 4A) gradually turns to rotational movement (as indicted by arrow 9 in FIG. 4B), as the arms 13, 14 interact with their respective slot 29 in the rail 22. PCIe card 31 is positioned to contact precisely PCB 40, as shown schematically in FIG. 4A. When it is desired to release PCIe card 31, the arm 14 is rotated by lifting upon thumbscrew 17. This action then pivots claw 21 upwardly as well, causing claw 21 to contact, and then lift flange 34 of PCIe card 31, releasing and simultaneously lifting PCIe card 31 out of contact with PCB 40. This action is capable of lifting PCIe card 31 over 6 mm, thereby permitting grasping and removal of PCIe card 31 from GPU tray 30 with a person's fingers.

Figure 5A:
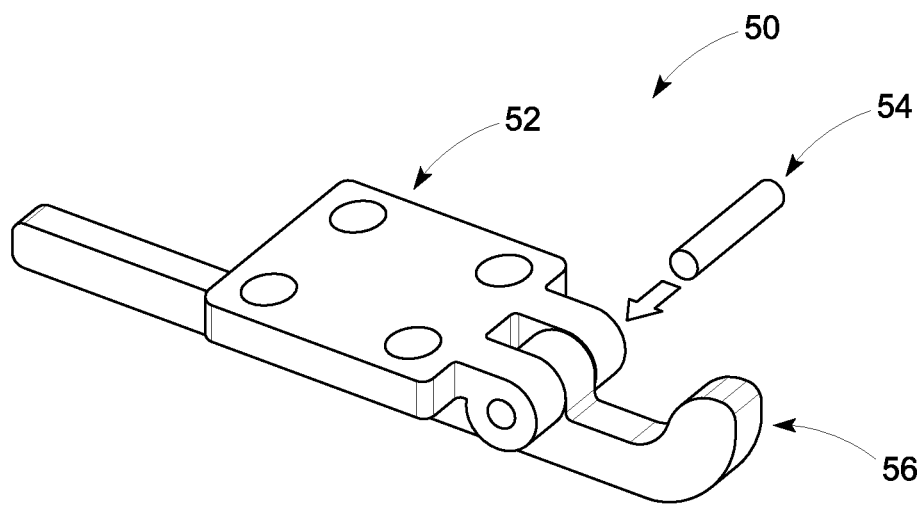
FIG. 5A is a schematic representation of an exploded view of a lifting lever structure, according to a second embodiment for lifting computer components from a computer.
Figure 5B:
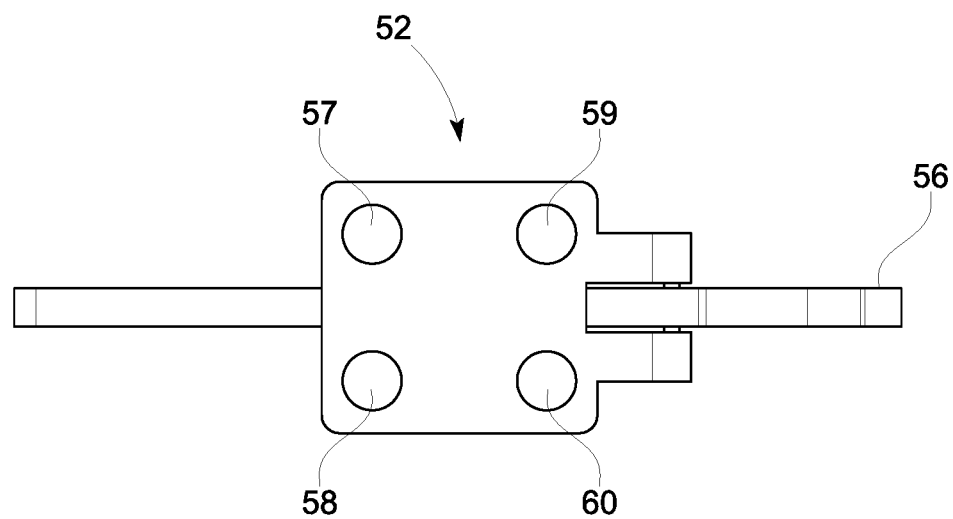
FIG. 5B is a schematic, plan view of the lifting lever structure of FIG. 5A.
Figure 5C:
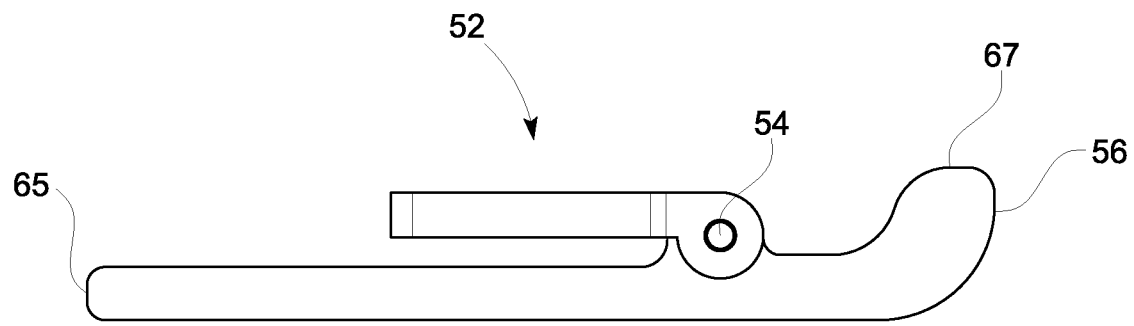
FIG. 5C is a schematic, elevation view of the lifting lever structure of FIG. 5A.
Figure 5D:
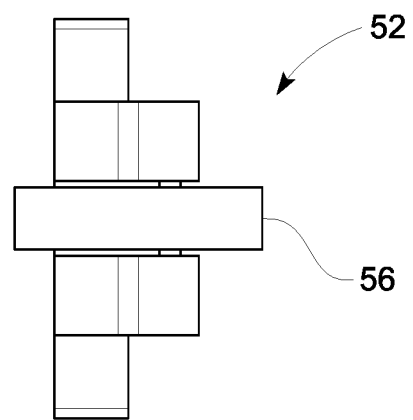
FIG. 5D is a schematic, right side view of the lifting lever structure of FIG. 5A.

FIGS. 5A-5D illustrate a second embodiment of a lifting mechanism that can be used with, or in place of, the release hook lifting structure of FIG. 1. FIG. 5A illustrates a lifting base 52, defining several opening 57, 58, 59, 60 to permit fasteners, such as screws (not shown) to pass through and secure the lifting base 52 to a support structure. The support structure could be the rail 22 (as shown in FIGS. 3B-3C), or the release hook 12 (of FIG. 1). FIG. 5B is a schematic, plan view of FIG. 5A. Bosses 61, 62 define an opening passing through bosses 61, 62 to receive a shaft 54 to secure release lever 56 to lifting base 52. FIG. 5C, which is a schematic, elevation view of FIG. 5A, clearly shows the pivoting connection between release lever 56 and lifting base 52. FIG. 5D is a schematic, right side view of FIG. 5A. Release lever 56 provides an alternative lifting action to that of lifting hook 12. FIG. 5A, shows a schematically illustrated a PCIe card release lever 50, which comprises a PCIe card release base 52. Pivotably coupled to PCIe card release base 52 is a PCIe release lever 56, which terminates in a nose 67 to contact the PCIe card. A shaft 54 acts as the coupling element for PCIe release lever 56 and PCIe release base 52, and also permits pivoting of PCIe card release lever 56 relative to PCIe release base 52. PCIe card release base 52 defines a plurality of apertures 57, 58, 59 60 for the purpose of receiving fasteners, such as screws or rivets, to secure the PCIe card release base to the tray or chassis of a computer. Further views of each of the components of FIG. 5A can be seen in FIGS. 5B, 5C, and 5D.

Figure 6A:
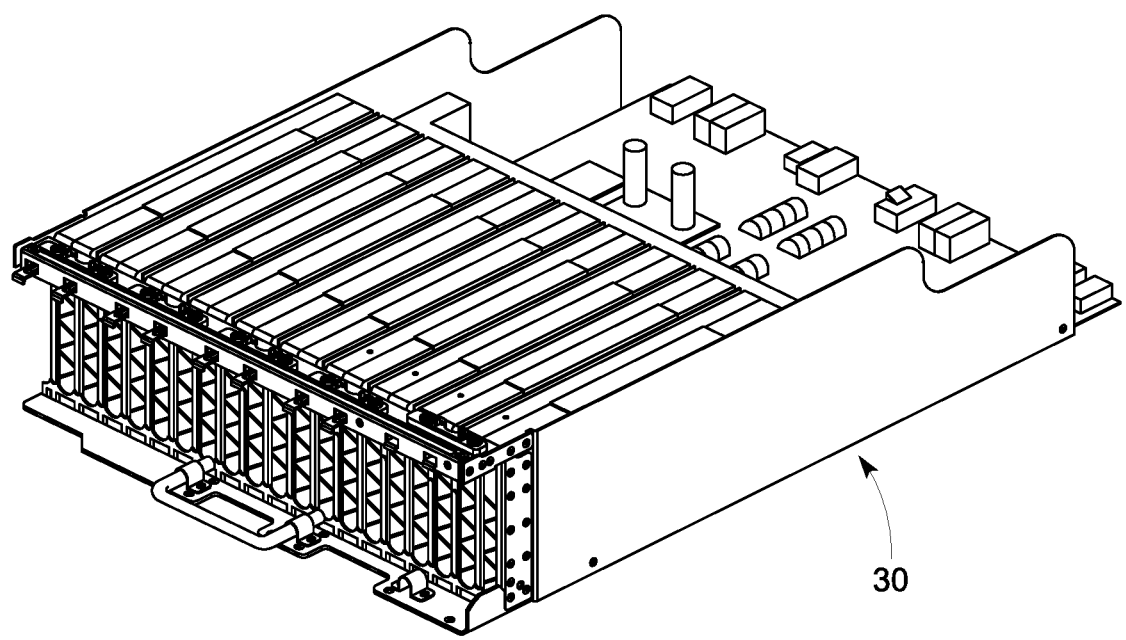
FIG. 6A is a schematic, perspective view of a GPU, including a plurality of PCIe cards contained therein, which are releasable by a combined operation of release hook and lifting lever.
Figure 6B:
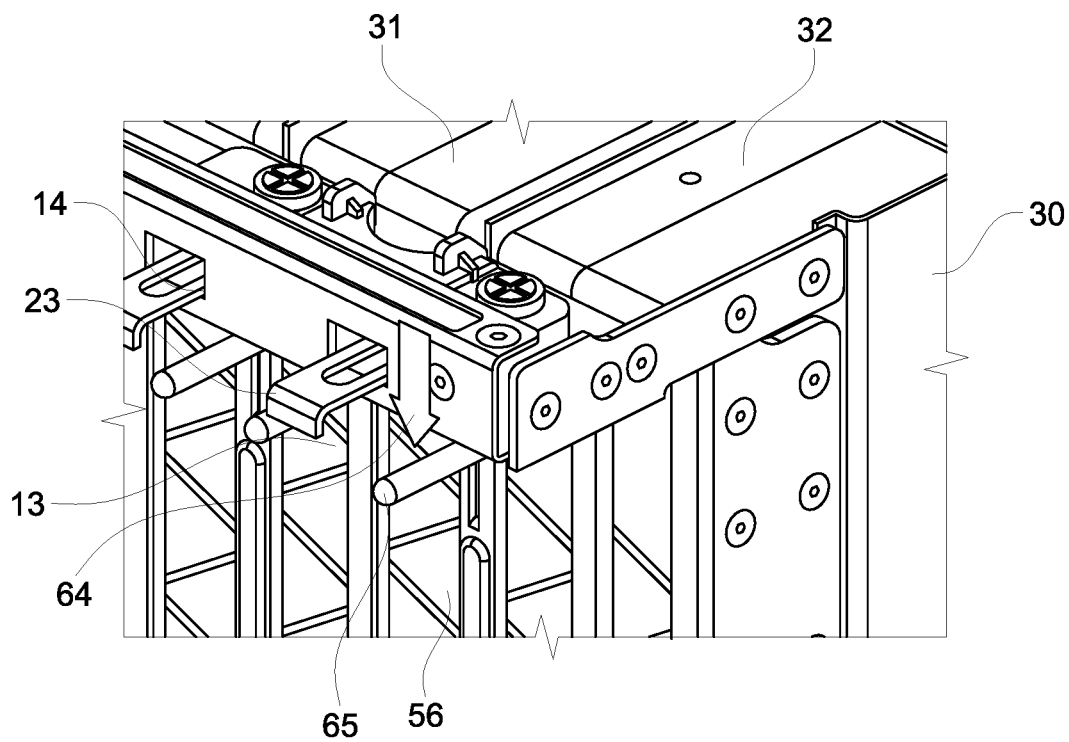
FIG. 6B is a schematic, enlarged view of the dotted line area 33 of FIG. 6A to show detail.
Figure 6C:
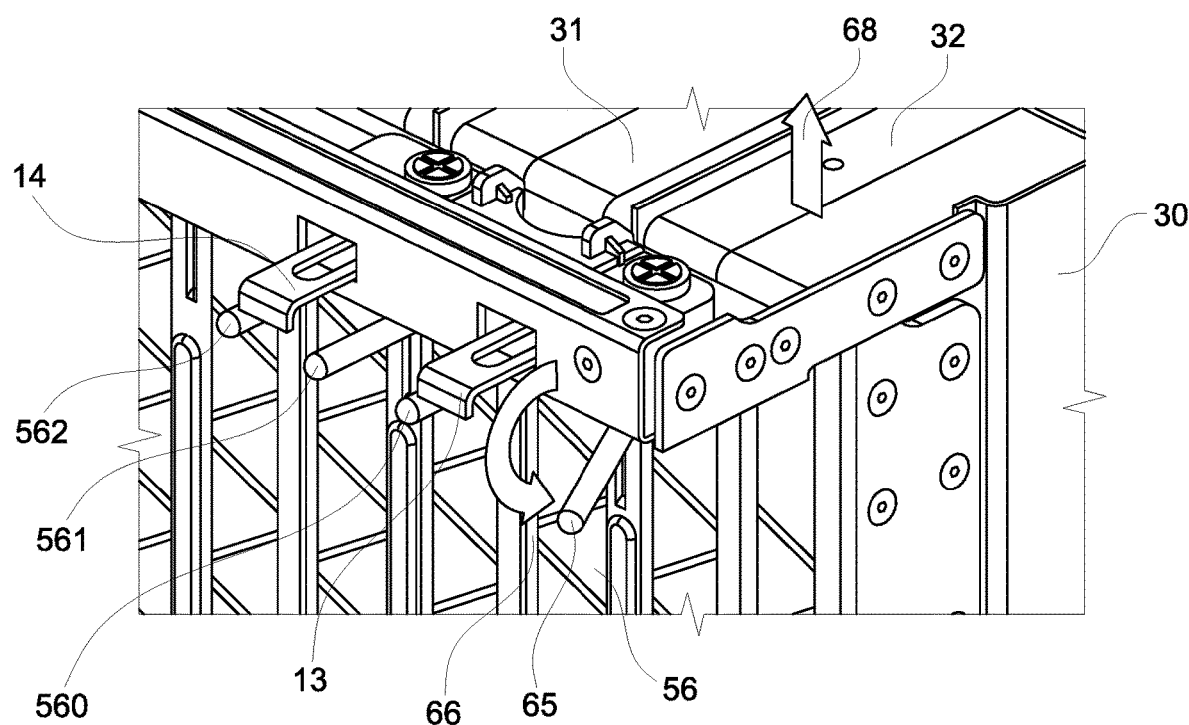
FIG. 6C is a schematic, enlarged view of FIG. 6A to show detail of the release of the PCIe cards.

Operation of PCIe release lever 56 will now be described in connection with FIGS. 6A-6C. GPU tray 30 contains a plurality of PCIe cards 31, 32, etc. PCIe card release lever 50 is mounted to the tray 30 by means of fasteners (not shown). When it is desired to release one of the PCIe cards from its place in tray 30, the end of release lever 56 is displaced downwardly by pushing against the protruding end 65 of release lever 56, as shown by arrow 64 in FIG. 6B. The protruding end 65 of release lever 56 will rotate, as shown by arrow 66 in FIG. 6C. The opposite end 67 (hidden in FIG. 6C, but illustrated in FIG. 5C) of release lever 56 will push upwardly against PCIe card 32, and lift it out of its position from within tray 30, as shown by arrow 68 in FIG. 6C.

Figure 7A:
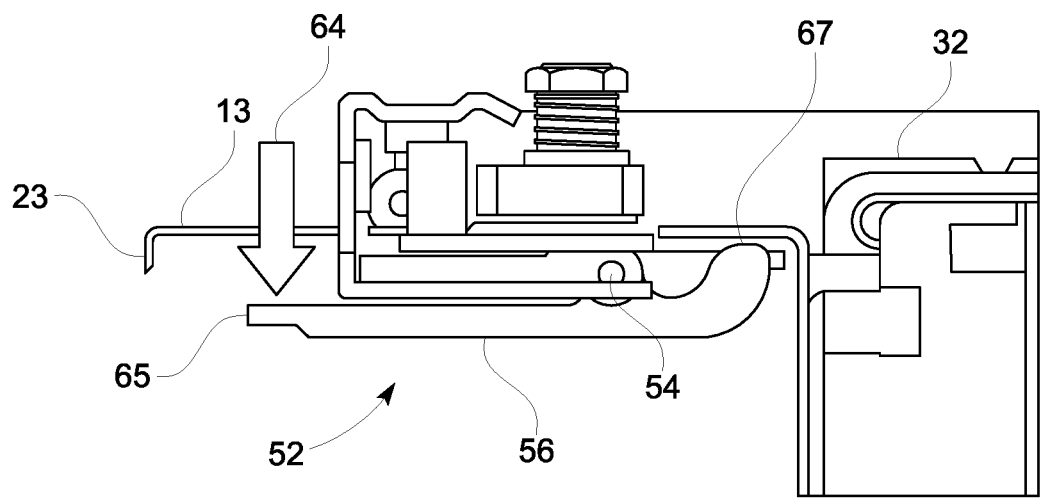
FIG. 7A is a schematic, representation of a system for releasing a secured PCIe card in a GPU.
Figure 7B:
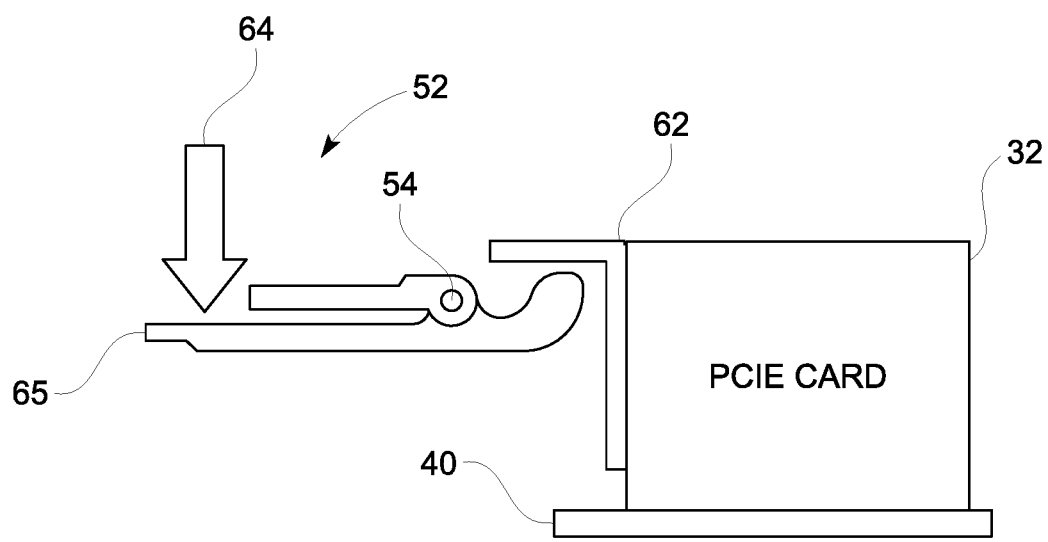
FIG. 7B is a schematic representation of the release lever portion only of FIG. 7A.
Figure 7C:
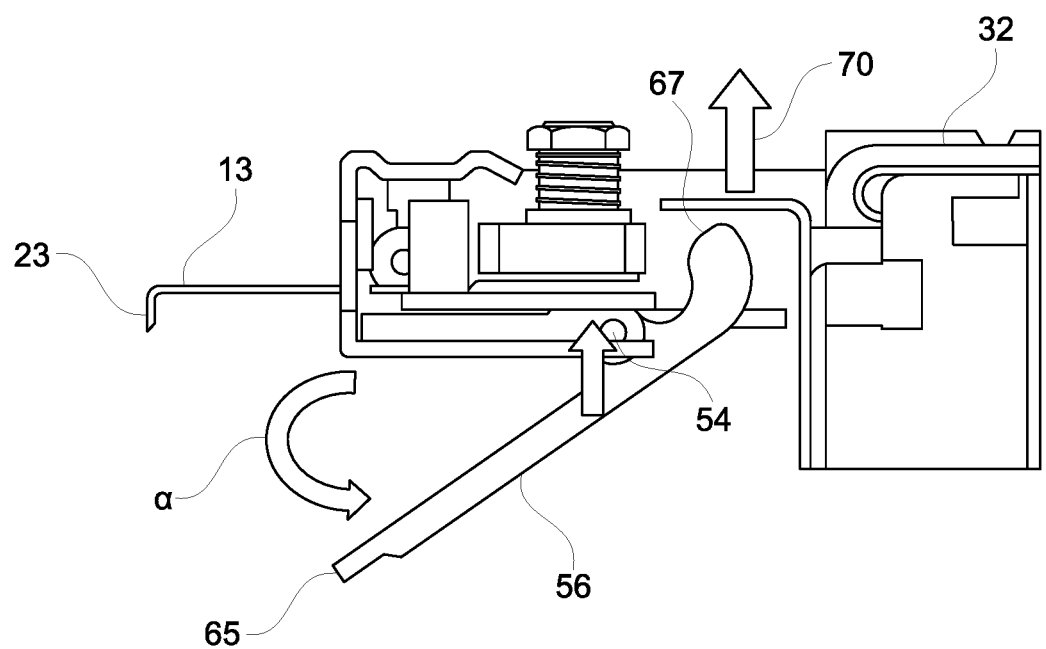
FIG. 7C is a schematic representation of the release lever lifting and releasing the PCIe card of FIG. 7A from a GPU.
Figure 7D:
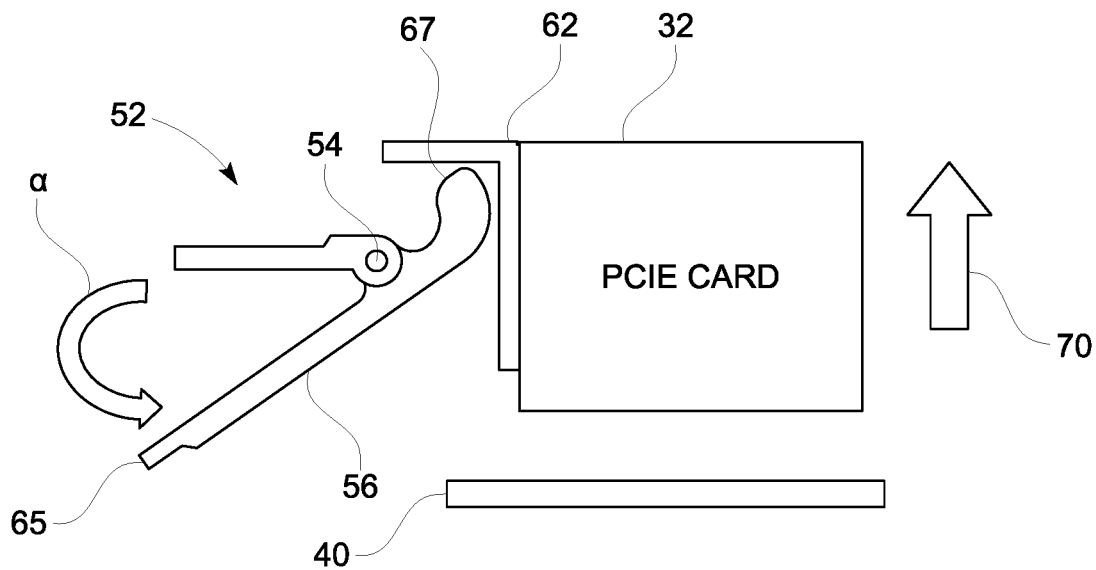
FIG. 7D is a schematic representation of the angular displacement of the release lever portion only in lifting and releasing the PCIe card of FIG. 7C from a GPU.

The operation of release lever 56 can be better understood in connection with the schematic representation of FIGS. 7A-7D. PCIe card 32 is in position against PCB 40, as shown in FIG. 7B. To release and lift the PCIe card 32, a downward force is exerted in the direction of arrow 64, and against protruding end 65 of release lever 56. As release lever 56 is pivotably mounted about shaft 54, the downward force exerted against protruding end 65 of release lever 56 translates to a rotational motion a about shaft 54. This brings the opposite end 67 of release lever 56 into contact with the PCIe card flange 34, thereby imparting an upwardly lifting force to PCIe bracket 62. This upwardly lifting force displaces PCIe card 32 away from the PCB 40. In some implementations, the rotational motion a can be up to and include an angle of about 35°. This can result in a lifting of PCIe card 32 in an amount of more than 6 mm. This lifting of PCIe card 32 (shown by arrow 70 in FIGS. 7C and 7D) can be selected so that it is sufficient to permit an operator to grasp PCIe card 32, and complete the removal of the PCIe card 32 or other computer component from the tray 30. The process can be repeated for the other PCIe cards e.g., PCIe card 31, within tray 30 by the use of levers 560, 561, 562 (FIG. 6C), respectively.

The terminology used herein is for the purpose of describing particular embodiments only and is not intended to be limiting of the invention. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. Furthermore, terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. An article of manufacture to release a computer component from a supporting structure, the article of manufacture comprising:
    a release hook, the release hook comprising at least one claw configured for engaging with, releasing, and lifting, the computer component from the supporting structure; the release hook further comprising at least one arm extending from the release hook to act as a lever for the release hook; the at least one arm extending horizontally away from the at least one claw;
    a rail, the rail comprising a series of slots therein, a distal end of the at least one arm extending horizontally away from the at least one claw extending through a slot in the rail; and
    a fixing element, the fixing element providing a structure upon which to mount the release hook, the fixing element being attached to the release hook, the fixing element being provided with at least one thumbscrew; the at least one thumbscrew extending through an aperture in the fixing element to engage the release hook adjacent to the at least one claw;
    whereby lifting of the thumbscrew upwardly directly acts to rotate the release hook and the at least one arm, with the rail acting as a pivot for the at least one arm whereby the at least one claw simultaneously releases and lifts the computer component from its supporting structure.

2. The article of manufacture according to claim 1, wherein the at least one arm comprises two arms extending from the release hook to act as levers, the two arms each extending in a horizontal direction away from the at least one claw and the distal ends of each arm engaging adjacent slots in the series of slots in the rail.

3. The article of manufacture of claim 2, wherein the rail retains and captures the distal ends of each of the two arms by configuring each of the two arms with a flange on the distal end each of the two arms.

4. The article of manufacture of claim 1, wherein the computer component is a Peripheral Component Internet Express (PCIe) card.

5. The article of manufacture of claim 4, wherein the supporting structure is a Graphics Processing Unit (GPU) tray.

6. The article of manufacture of claim 4, wherein the amount of lift imparted to the PCIe card by the at least one claw is sufficient for the PCIe card to be grasped by human fingers.

7. The article of manufacture of claim 6, wherein the supporting structure for the PCIe card is a GPU tray.

8. The article of manufacture of claim 1, wherein the rail retains and captures the distal end of the at least one arm by configuring the at least one arm with a flange on the distal end of said one arm.

* * * * *